US008347172B2

(12) United States Patent
Kwon et al.

(10) Patent No.: US 8,347,172 B2
(45) Date of Patent: Jan. 1, 2013

(54) METHOD FOR DECODING USING DYNAMIC SCHEDULING SCHEME FOR LOW DENSITY PARITY CHECK CODES AND APPARATUS THEREOF

(75) Inventors: Dong Seung Kwon, Daejeon (KR); Choongil Yeh, Daejeon (KR); Min Sik Seo, Daejeon (KR); Young Seog Song, Daejeon (KR); Byung-Jae Kwak, Seoul (KR); Ji Hung Kim, Daejeon (KR); Wooram Shin, Daejeon (KR); Hong-Yeop Song, Seoul (KR); Jung-Hyun Kim, Seoul (KR); Mi-Young Nam, Seoul (KR)

(73) Assignees: Electronics and Telecommunications Research Institute, Daejon (KR); Industry-Academic Cooperation Foundation, Yonsei University, Seoul (KR)

( * ) Notice: Subject to any disclaimer, the term of this patent is extended or adjusted under 35 U.S.C. 154(b) by 737 days.

(21) Appl. No.: 12/497,114

(22) Filed: Jul. 2, 2009

(65) Prior Publication Data

US 2010/0153811 A1 Jun. 17, 2010

(30) Foreign Application Priority Data

Dec. 12, 2008 (KR) .................. 10-2008-0126676
Feb. 27, 2009 (KR) .................. 10-2009-0016799

(51) Int. Cl.
*H03M 13/00* (2006.01)

(52) U.S. Cl. ........................ 714/755; 714/786
(58) Field of Classification Search ............. 714/755, 714/786
See application file for complete search history.

(56) References Cited

U.S. PATENT DOCUMENTS

2009/0319861 A1* 12/2009 Sharon et al. ............. 714/752

OTHER PUBLICATIONS

Gal Elidan, et al. "Residual Belief Propagation: Informed Scheduling for Asynchronous Message Passing", Proc. $22^{nd}$ Conference on Uncertainty in Artificial Intelligence, MIT, Jul. 2006.
Jung-Hyun Kim, et al., "Variable-to-Check Residual Belief Propagation for LDPC Codes," Korea Information and Communications Society Summer Conference, Jul. 2, 2008.
Mi-Young Nam, et al. "Node-wise Variable-to-Check Residual Belief Propagation Decoding of LDPC Codes," Korea Information and Communications Society Summer Conference, Jul. 2, 2008.
Jung-Hyun Kim, et al. "Variable-to-Check Residual belief Propagation for Informed Dynamic Scheduling of LDPC Codes", International Symposium of Information Theory and its Applications, ISITA2008, Dec. 7-10, 2008.

* cited by examiner

*Primary Examiner* — Guy Lamarre
(74) *Attorney, Agent, or Firm* — Staas & Halsey LLP

(57) ABSTRACT

Disclosed is a decoding method and device for low density parity check codes using dynamic scheduling. The low density parity check codes are sequentially decoded, and the messages are scheduled in the descending order of the difference between values before and after updating the message transmitted from the variable node to the check node.

16 Claims, 9 Drawing Sheets

(a)

(b)

(a)

(b)

| | BP | RBP | VCRBP |
|---|---|---|---|
| Number of generating $m_{c \to v}$ in single decoding process | 1 | $(d_v-1)(d_c-1)+1$ | $d_c-1$ |

METHOD FOR DECODING USING DYNAMIC SCHEDULING SCHEME FOR LOW DENSITY PARITY CHECK CODES AND APPARATUS THEREOF

CROSS-REFERENCE TO RELATED APPLICATION

This application claims priority to and the benefit of Korean Patent Applications No. 10-2008-0126676 filed in the Korean Intellectual Property Office on Dec. 12, 2008 and No. 10-2009-0016799 filed in the Korean Intellectual Property Office on Feb. 27, 2009, the entire contents of which are incorporated herein by reference.

BACKGROUND OF THE INVENTION (a) Field of the Invention

The present invention relates to a decoding method. More particularly, the present invention relates to a decoding method and device using dynamic scheduling for low density parity check codes.

(b) Description of the Related Art

In order to satisfy the high data rate of the current next generation mobile communication system, studies on a encoding method having efficient performance with a short length and a decoding method with fast convergence rates have progressed, and particularly, various decoding methods for low density parity check (LDPC) codes have been aggressively studied.

Regarding the LDPC codes decoding method, a check node or a variable node receives a message from the neighboring node to update it, returns the updated message to the corresponding neighboring nodes, and then repeats this process to correct the errors and decode the message. An output message of the variable node or the check node represents a function of messages coming into the node except the line for transmitting the message, that is, the message coming from the edge.

The method for determining the order of updating the messages is called scheduling, and the scheduling decoding method is classified as a static scheduling decoding method for sequentially updating the messages according to a fixed order and a dynamic scheduling decoding method for dynamically updating the messages.

The static scheduling decoding method is classified as a shuffled belief propagation (SBP) method and a layered belief propagation (LBP) method depending on the update in the variable node direction or the update in the check node direction. After introduction of the SBP and the LBP, various modified types of schemes have been researched.

The existing scheduling decoding method is also called a residual belief propagation (RBP) method, and it initially updates the message with the greatest variation between before and after the update from among the messages transmitted from the check node to the variable node.

The fact that a difference of the message value between before the update and after the update is near 0 indicates that the message is almost converged, and the fact that a difference of the message value between before the update and after the update is great indicates that the message is not converged. Therefore, the convergence rate of the dynamic scheduling decoding method for updating the message that is not converged in advance to other ones is much faster than the decoding convergence rate of the static scheduling decoding method such as the SBP and the LBP for updating the messages according to a fixed order. Also, since the dynamic scheduling decoding method can efficiently solve a trapping set error, it outperforms the static scheduling decoding method.

However, since the existing dynamic scheduling decoding method for LDPC codes performs scheduling in the order starting from the great difference between before the update and after the update of the message transmitted from the check node to the variable node, the decoding convergence rate becomes faster, but the reliability of the message transmitted from the check node to the variable node is worsened because it is based on only one check equation. In detail, the same method may greatly mistakenly determine the message, but the erroneously determined message can be updated in advance to cause a new error.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a decoding method and device for LDPC codes using more reliable dynamic scheduling.

The present invention has been made in an effort to provide a decoding method and device using dynamic scheduling with less complexity and easy realization.

An exemplary embodiment of the present invention provides a method for defining a plurality of check nodes and variable nodes from a parity check matrix and performing a decoding process based on the nodes, including: comparing arrangement reference values of variable-check messages transmitted from the variable node to the check node, selecting the variable-check message with the greatest arrangement reference value, and transmitting the selected variable-check message to the first variable node from the first check node; updating a check-variable message transmitted from the first check node to the second variable node, regarding the second variable nodes connected to the first check node; and generating an arrangement reference value of the variable-check message transmitted from the second variable node to the second check node based on the updated check-variable message, regarding the second check nodes connected to the second variable node.

The method further includes finding a first variable node connected to the selected variable-check message, and updating the variable-check messages transmitted from the first variable node to the entire first check nodes connected to the first variable node.

Another embodiment of the present invention provides a device for defining a plurality of check nodes and variable node from a parity check matrix and performing a decoding process, including: a reset unit for resetting variable-check messages transmitted from the variable node to the check node and resetting check-variable messages transmitted from the check node to the variable node; a check node updater for updating variable-check messages transmitted from the variable node to the check node; a variable node updater for updating check-variable messages transmitted from the check node to the variable node; and a processor for comparing arrangement reference values of the entire variable-check messages and selecting a variable-check message that has the greatest arrangement reference value and that is transmitted from the first variable node to the first check node.

The variable node updater updates a check-variable message transmitted from the first check node to the second variable node according to control by the processor, regarding the entire second variable node connected to the first check node, and the check node updater generates an arrangement reference value of a variable-check message transmitted from the second variable node to the second check node base on the updated check-variable message, regarding the entire second check nodes connected to the second variable node.

DETAILED DESCRIPTION OF THE EMBODIMENTS

Figure 1:
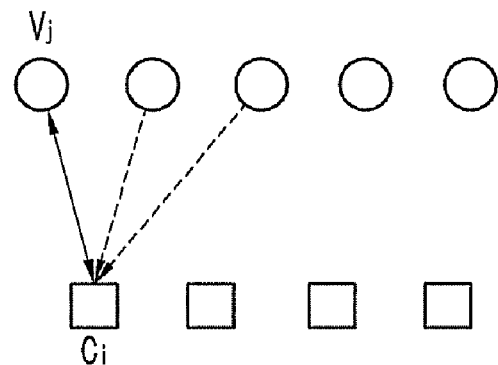
FIG. 1 shows a decoding process using an existing dynamic scheduling scheme of LDPC codes.
Figure 1:
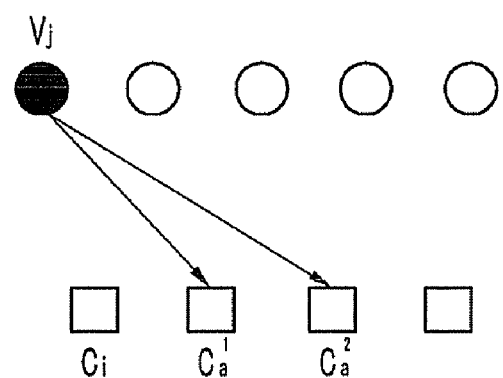
Figure 1:
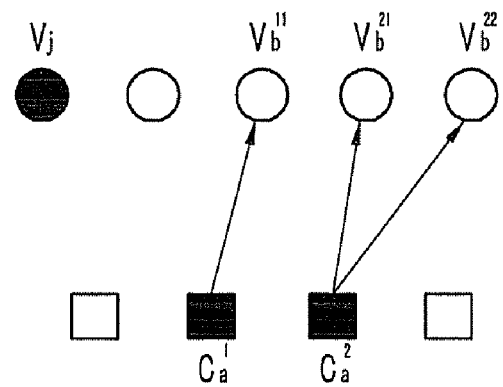

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising" will be understood to imply the inclusion of stated elements but not the exclusion of any other elements.

An exemplary embodiment of the present invention will now be described in detail with reference to accompanying drawings.

The decoding method according to the exemplary embodiment of the present invention is performed by using a parity check matrix and a Tanner graph, and the parity check matrix can be expressed with the Tanner graph. Check nodes are generated by the number of rows and variable nodes are generated by the number of columns to form a Tanner graph. When the element of the matrix (i,j) is 1, the i-th check node and the j-th variable node are connected through an edge and thereby become neighboring nodes.

The LDPC codes are iteratively decoded through repetitive message transmission between the variable node and the check node. When the check node $c_i$ and the variable node $v_j$ are neighboring nodes, the messages are generated as follows.

$$m_{v_j \to c_i} = \sum_{c_a \in N(v_j) \setminus c_i} m_{c_a \to v_j} + C_{v_j} \quad \text{[Equation 1]}$$

$$m_{c_i \to v_j} = 2 \operatorname{arctanh}\left(\prod_{v_b \in N(c_i) \setminus v_j} \tanh\left(\frac{m_{v_b \to c_i}}{2}\right)\right) \quad \text{[Equation 2]}$$

Here, $m_{v_j \to c_i}$ is a function for updating the message transmitted from the variable node $v_j$ to the check node $c_i$, and it is called a variable-check message. $m_{c_i \to v_j}$ is a function for updating the message transmitted from the check node $c_i$ to the variable node $v_j$, and it is called a check-variable message.

Also, $C_{v_j}$ is channel information for the variable node $v_j$, and can be indicated as $$C_{v_j} = \log\left(\frac{p(r_j | v_j = 0)}{p(r_j | v_j = 1)}\right).$$

Here, $r_j$ represents a received signal.

Also, $c_a \in N(v_j) \setminus c_i$ represents check nodes except the i-th check node from among the check nodes connected to the j-th variable node.

$v_b \in N(c_a) \setminus v_j$ shows variable nodes except the j-th variable node from among the variable nodes connected to the check nodes ($c_a$).

A general decoding method will now be described before the decoding method using the above-featured LDPC codes according to an exemplary embodiment of the present invention is described.

Regarding the general LDPC code decoding method, the check-variable message is updated by using the value of the variable-check message acquired in the (i−1)-th iterative process in the i-th iterative process. The variable-check messages are updated by using the check-variable message that is newly acquired in the previous stage. The process is repeated until the stop condition is satisfied. Here, the variable-check message can be expressed in Equation 1, and the check-variable message can be expressed in Equation 2.

Particularly, the existing dynamic scheduling scheme initially updates the message with the greatest arrangement reference value called the residual, and it is called the residual belief propagation (RBP). Here, the arrangement reference value is generated from the difference between the value of before updating the check-variable message and the value after updating the same, and it is expressed as follows.

$$r(m_{c_i \to v_j}) = \|m^*_{c_i \to v_j} - m_{c_i \to v_j}\| \quad \text{[Equation 3]}$$

Here, $r(m_{c_i \to v_j})$ represents an arrangement reference value, and $m^*_{c_i \to v_j}$ is the value of the check-variable message newly generated by updating.

FIG. 1 shows a decoding process following the existing dynamic scheduling of LDPC codes.

As shown in FIG. 1, the decoding process according to the general dynamic scheduling, that is the RBP decoding process, is classified as three stages. In FIG. 1, the variable node and the check node are respectively shown as a circle and a quadrangle.

In the first stage ((a) of FIG. 1), the difference of values of before and after updates of the check-variable messages is found and then it is assumed that the check-variable message $m_{c_i \to v_j}$ that is transmitted through an edge for connecting a pair of the check node and the variable node having the greatest reference value is selected. Since the selected check-variable message value is substantially changed, the corresponding variable node may be very probably determined as another value. Therefore, when the check-variable message for the corresponding variable node is updated in advance, it is helpful to accurately determine another node and the entire decoding performance can be improved. Therefore, the check-variable message with the greatest arrangement reference value is selected in advance.

After this, the selected message is updated and the corresponding edge is excluded from the target to be processed. That is, the arrangement reference value of the check-variable message transmitted through the edge connected to the check node ($c_i$) and the variable node ($v_j$) is processed as 0 ($r(m_{c_i \to v_j})=0$) so it may not be further selected in the current iterative decoding process.

In the second stage ((b) of FIG. 1), $c_a \in N(v_j) \setminus c_i$ are updated That is, the value of the variable-check message $m_{v_j \to c_a}$ for the check nodes ($c_a$) excluding the i-th check node ($c_i$) connected to the excluded edge from among the check nodes connected to the j-th variable node is produced.

In the third stage ((c) of FIG. 1), the arrangement reference values ($r(m_{c_a \to v_b})$) for $v_b \in N(c_a) \setminus v_j$, that is, the arrangement reference values to be used for the next decoding process are updated. The scheduling process is performed based on the difference between the valued acquired before and after updating the check-variable messages, and since the messages transmitted from the check nodes ($c_a$) to the variable nodes ($v_b$) are updated, it is needed to newly generate arrangement reference values for the edges corresponding to the messages.

In detail, based on the values of the variable-check messages acquired through the second stage, the arrangement reference value ($r(m_{c_a \to v_b})$) that is the difference between before and after updating the check-variable messages for the variable nodes ($v_b$) except the j-th variable node ($v_j$) connected to the excluded edge from among the variable nodes connected to the check nodes ($c_a$).

The messages that are not yet selected, that is, the check-variable messages except the message selected in the first stage, are rearranged according to the arrangement reference value. For example, the check-variable messages can be arranged in the descending order of the arrangement reference values.

Through the above-noted stages, the messages (or edges) are updated once in one iterative decoding process.

The above-featured existing RBP decoding method requires improvements of error correction performance and complexity even though it is an efficient decoding method with a fast decoding convergence rate.

In detail, the existing RBP decoding method generates the arrangement reference value from the change of the message value based on a single check equation. That is, as shown in Equation 2, the arrangement reference value is generated based on the check equation for the variable nodes connected to a single check node. As a result, when the erroneously determined message has the greatest arrangement reference value in the RBP decoding method which is the greedy algorithm, a new error that does not occur in the static scheduling decoding method may be generated and propagated.

Further, compared to the other existing decoding methods in which a single decoding process is finished when the message to be transmitted from the variable node to the check node is updated, the arrangement reference value is generated based on the check-variable message in the RBP decoding method, and it is required to additionally update the message transmitted from the check node to the variable node. Particularly, when the check-variable message is updated, the message value $m_{c \to v}$ that is generated when the arrangement reference value ($r(m_{c \to v})$) is generated in the previous decoding process is repeatedly generated, which is an unnecessary stage.

In addition, the messages (Q) that are not selected each time the arrangement reference values of the respective messages are unnecessarily rearranged. Here, the messages (Q) are arranged by the size of the reference value, and they show a set of messages that are not yet updated.

Therefore, a decoding method using the dynamic scheduling scheme of LPDC codes for reducing the error rates and preventing an undesired process will be provided in an exemplary embodiment of the present invention. Particularly, in the exemplary embodiment of the present invention, the difference of values before and after updating the message transmitted from the variable node to the check node is used as an arrangement reference value for scheduling.

Figure 2:
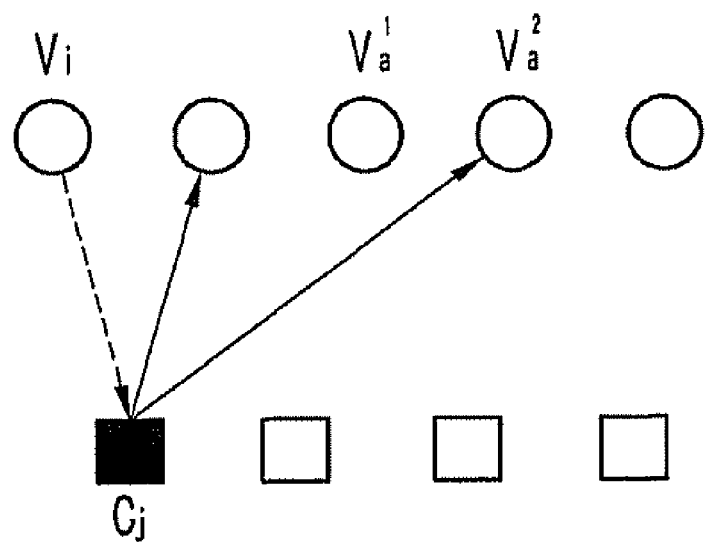
FIG. 2 shows a decoding process according to a first exemplary embodiment of the present invention.
Figure 2:
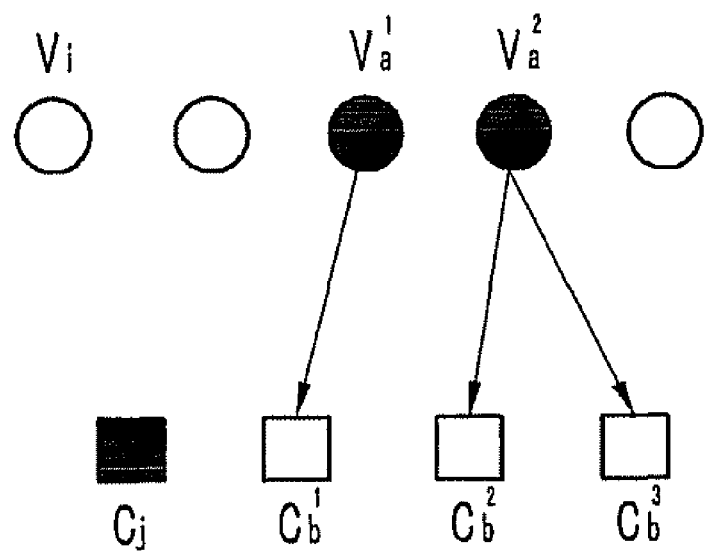
Figure 3:
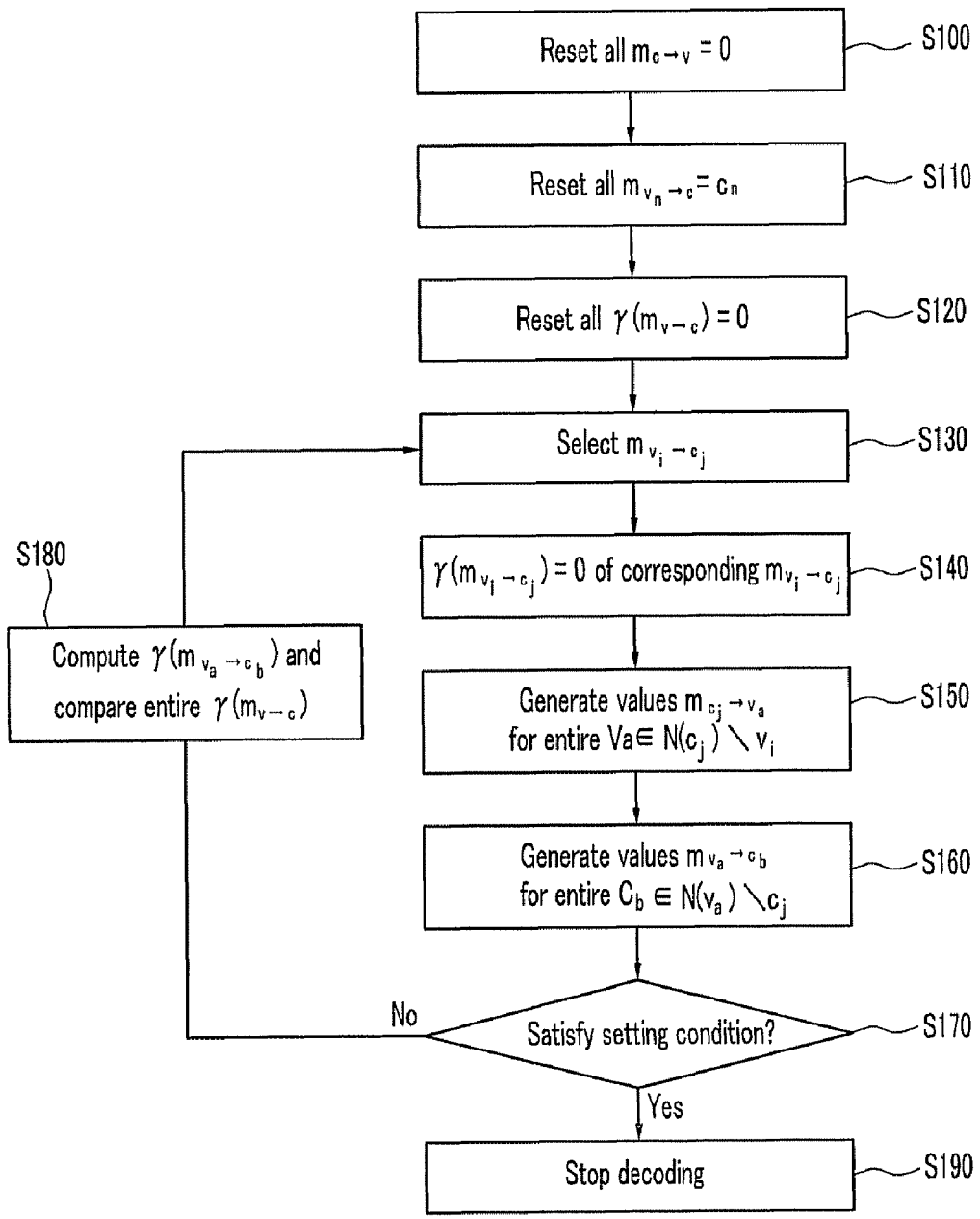
FIG. 3 shows a flowchart of a decoding method according to a first exemplary embodiment of the present invention.

FIG. 2 shows a decoding process according to a first exemplary embodiment of the present invention, and FIG. 3 shows a flowchart of a decoding method of a decoding process of FIG. 2 according to a first exemplary embodiment of the present invention. The decoding method according to the first exemplary embodiment of the present invention can be called the variable-check RBP (VCRBP) method.

As shown in FIG. 3, the values of the check-variable messages are reset to be a first value (0 in this case), and the values of the variable-check messages are reset to be a second value ($C_n$ representing a channel value) ($m_{v_n \to c_n C_n}$) (S100-S110).

Since there is no performed decoding process in the initial decoding process, the values $r(m_{v \to c})$ are reset to be 0 (S120). In this instance, the corresponding message is not excluded from the update target. After the reset, a variable-check message ($m_{v_i \to c_j}$) to be initially updated is randomly established. For example, one of the variable-check messages for the variable node with the greatest number of connected check nodes is selected. However, after this, $m_{v_i \to c_j}$ corresponding to the greatest $r(m_{v \to c})$ is selected (S130).

The arrangement reference value of the selected variable-check message is set to be 0 ($r(m_{v_i \to c_j})=0$) and is then excluded from the processing target (S140). In FIG. 2 (a), the message excluded from the processing target is shown with the dotted line. The values $v_a \in N(c_j) \setminus v_i$ are updated. That is, the i-th variable node from among the variable nodes connected to the j-th check node generates the values $m_{c_j \to v_a}$ of the check-variable messages for the excluded variable nodes ($v_a$) (S150).

As shown in the second stage (b) of FIG. 2, the values $c_b \in N(v_a) \setminus c_j$ are updated (S160). That is, the values $m_{v_a \to c_b}$ of the variable-check messages for the check nodes ($c_b$) except the excluded j-th check node from among the check nodes connected to the variable nodes ($v_a$) are generated.

It is determined whether a setting condition for terminating the decoding process has been satisfied (S170), and when the setting condition is not satisfied, the arrangement reference value ($r(m_{v_a \to c_b})$) that is the difference between the values before and after updating is generated based on the values of the variable-check messages acquired in S160, and the greatest arrangement reference value is found from among the arrangement reference values of the variable-check messages (S180).

The arrangement reference value of the variable-check messages according to an exemplary embodiment of the present invention can be expressed as follows.

$$r(m_{v_i \to c_j}) = \|m^*_{v_i \to c_j} - m_{v_i \to c_j}\|  \quad \text{[Equation 4]}$$

Here, $m^*_{v_i \to c_j}$ represents the value of the variable-check message newly generated through an update.

As expressed in Equation 2, the check-variable message is generated based on the check equation relating to a single check node, and the variable-check message is generated based on the check equation relating to the check nodes except one as expressed in Equation 1. Therefore, in the exemplary embodiment of the present invention, the entire codes can be decoded more accurately based on the arrangement reference value acquired from the more reliable message, that is, the variable-check message.

In detail, the values $r(m_{v \to c})$ of the entire variable-check messages are found based on Equation 4, and the values $r(m_{v \to c})$ are then compared with each other. The above-described stages S130-S170 are repeated according to the results.

When the setting condition is satisfied, the decoding process is terminated (S190).

According to the first exemplary embodiment of the present invention, the arrangement reference value is generated from the variable-check messages based on the check equation relating to the entire check nodes except one, and the entire codes can be decoded with further reliability.

The decoding method according to the first exemplary embodiment of the present invention selects the message (or edge) with the greatest difference between before and after updating the message. Accordingly, one message that is an edge is selected for each time, and the entire edges are to be selected so as to finish one decoding process. For example, when the number of the entire variable nodes is N and the number (i.e., degree) of the average edge held by the respective variable nodes is $d_v$, a process for selecting $N \cdot d_v$-times messages (or edges) is required so as to finish the entire one decoding process.

Accordingly, a decoding method for reducing the message selecting process during the decoding process in a like manner of the first exemplary embodiment will be described in the second exemplary embodiment of the present invention.

In the second exemplary embodiment of the present invention, when the variable-check message with the greatest arrangement reference value is selected, the message is transmitted once through the edges connected to the corresponding variable node. As a result, the number of selecting the variable-check message during one iterative decoding process is reduced to be N.

In detail, the scheduling process is performed based on the selection of a pair of the variable node and the check node with the great difference of the messages before and after update, which means that the corresponding variable node is updated in the previous decoding process and the message value coming out of the variable node is greatly changed. Therefore, when the variable-check message transmitted through the edge connected to the corresponding variable node has the greatest arrangement reference value and is thus selected, the variable-check messages to be transmitted through another edge connected to the variable node may have a great arrangement reference value and may be very probably selected. Therefore, in the second exemplary embodiment of the present invention, when the edge with the greatest arrangement reference value, that is, the variable-check message is selected, the variable-check messages are transmitted through other edges connected to the variable node corresponding to the corresponding message.

Figure 4:
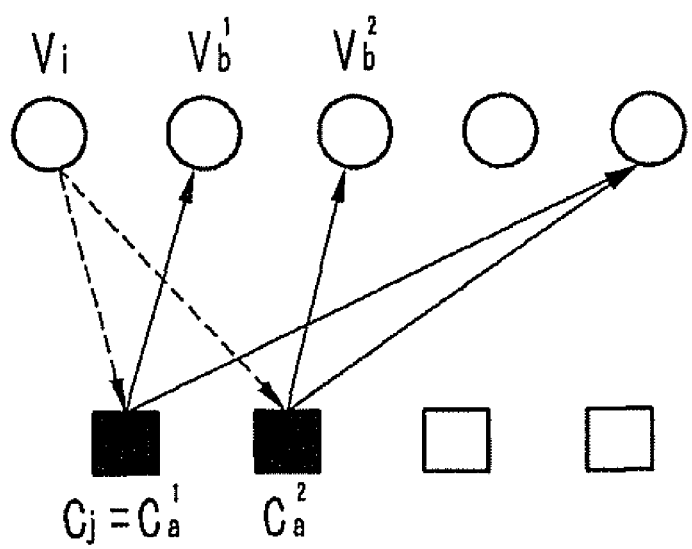
FIG. 4 shows a decoding process according to a second exemplary embodiment of the present invention.
Figure 4:
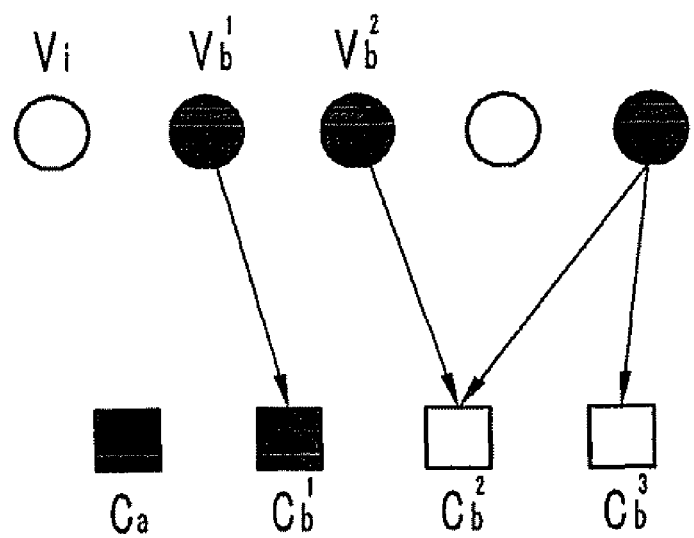
Figure 5:
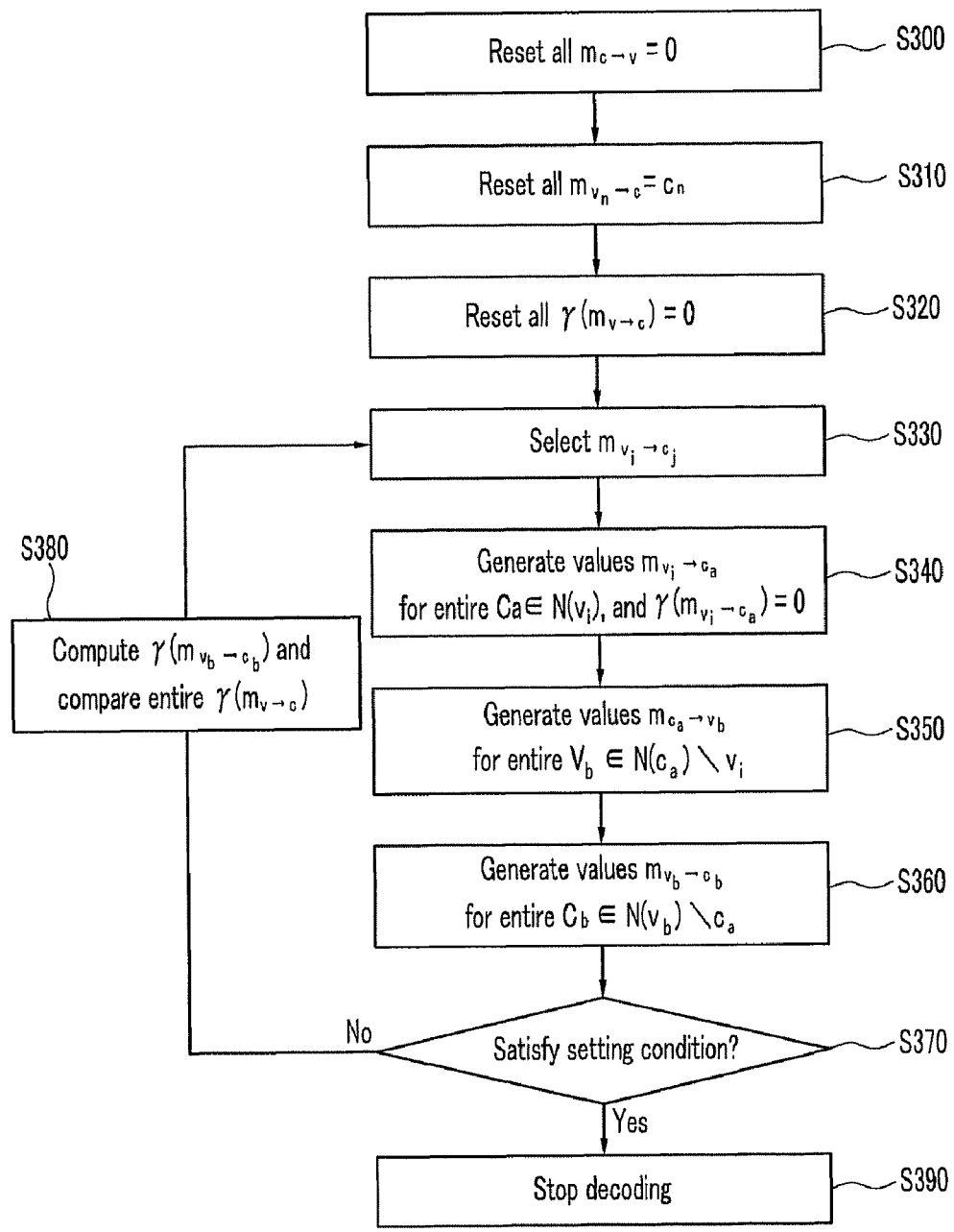
FIG. 5 shows a flowchart of a decoding method according to a second exemplary embodiment of the present invention.

FIG. 4 shows a decoding process according to a second exemplary embodiment of the present invention, and FIG. 5 shows a flowchart of a decoding method for a decoding process of FIG. 4 according to a second exemplary embodiment of the present invention. The decoding method according to the second exemplary embodiment of the present invention can be called the node-wise VCRBP (NVCRBP) method.

As shown in FIG. 5, the values of the check-variable messages are reset to be a first value (e.g., $m_{c \to v} = 0$), and the values of the variable-check messages are reset to be a second value (e.g., $m_{v_q \to c=c_n}$) (S300-S310).

Since there is no previously-performed decoding process in the initial decoding process, the values $r(m_{v \to c})$ are reset to be 0 (S320). In this instance, the corresponding message is not excluded from the update target. After the resetting, a variable-check message ($m_{v_i \to c_j}$) to be initially updated is determined. For example, one of the variable-check messages of the variable node with the greatest number of the connected check nodes is selected. After this, $m_{v_i \to c_j}$ corresponding to the greatest $r(m_{v \to c})$ is selected (S330).

The values $c_a \in N(v_i)$ are updated. That is, the variable-check messages ($m_{v_i \to c_a}$) to be transmitted to the check nodes ($c_a$) connected to the variable node ($v_i$) found in S330 are updated. The value $r(m_{v_i \to c_a})$ of the variable-check messages ($m_{v_i \to c_a}$) are set to be 0 to be thus excluded from the processing target (S340). In the second exemplary embodiment of the present invention, the variable-check messages for the check nodes ($c_a$) connected with edges to the selected variable node ($v_i$) are updated to be excluded from the processing target, and hence, another edge connected to the variable node ($v_i$) is not selected in the next iterative stage. As a result, the decoding rate is improved by reducing the number of selecting the edge performed during a single iterative process.

As shown in FIG. 4 (a), the values $v_b \in N(c_a) \backslash v_i$ are updated. That is, the values of the check-variable messages $M_{c_a \to v_b}$ transmitted to the variable nodes ($v_b$) except the selected i-th variable node ($v_i$) from among the variable nodes connected with edges to the check node ($c_a$) based on the updated values (S350).

As shown in FIG. 4 (b) and as shown in FIG. 5, the variable-check messages $m_{v_b \to c_b}$ for $c_b \in B(v_b) \backslash c_a$, that is, the check nodes ($c_b$) except the check nodes ($c_a$) connected with edges to the selected variable node ($v_i$) from among the check nodes connected to the variable node ($v_b$), are generated (S360).

It is then determined whether a predetermined condition for terminating the decoding process has been satisfied (S370), and when the condition is not satisfied, the arrangement reference value $r(m_{v_b \to c_b})$ that is the difference of the values before and after the update is found based on the messages $m_{v_b \to c_b}$ acquired in S360, and the values $r(m_{v \to c})$ are compared with each other (S380). The above-described stages S330-S370 are repeated according to the result. When the condition is satisfied, the decoding process is terminated (S390).

The decoding methods according to the exemplary embodiments of the present invention can be realized by using the subsequent decoding device.

The decoding device according to the exemplary embodiment of the present invention decodes the input received signals by using the parity check matrix and the Tanner graph based on the decoding methods according to the exemplary embodiment of the present invention. The input received signals can be processed with the codeword of the length n so as to be decoded. The check matrix can be expressed as a Tanner graph. The check nodes are generated by the number of rows and the variable nodes are generated by the number of columns to form a Tanner graph. When the element of the matrix (i,j) is 1, the i-th check node and the j-th variable node are connected with an edge to thus become neighboring nodes.

Figure 6:
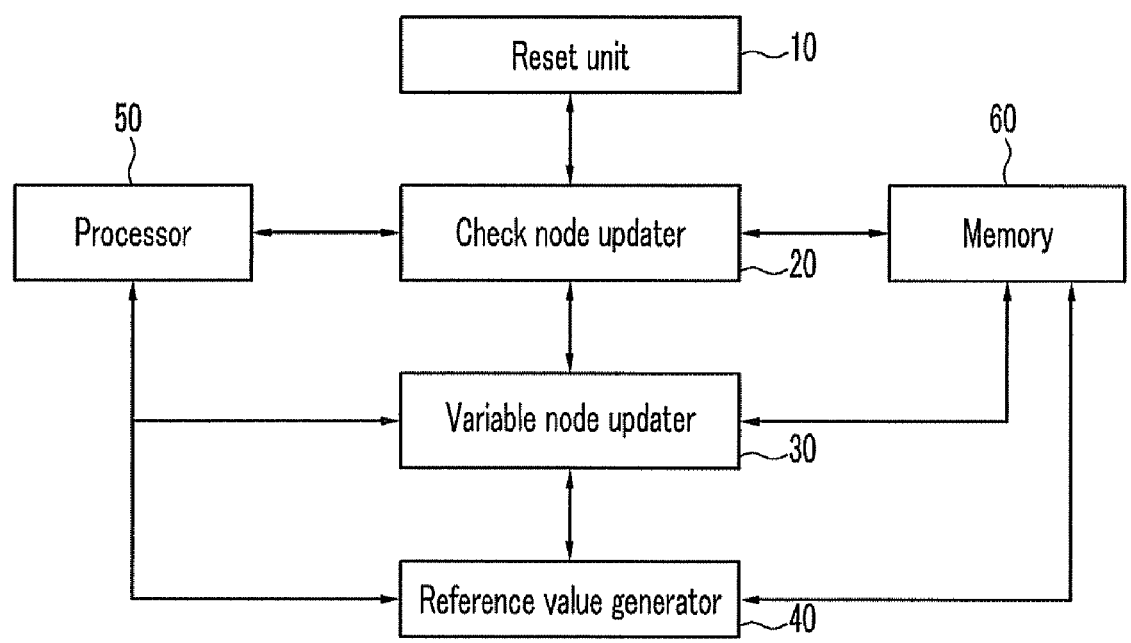
FIG. 6 shows a decoding device according to an exemplary embodiment of the present invention.

FIG. 6 shows a decoding device according to an exemplary embodiment of the present invention.

As shown in FIG. 6, the decoding device according to the exemplary embodiment of the present invention includes a reset unit 10 for resetting the messages transmitted from the variable nodes to the check nodes and resetting the messages transmitted from the check nodes to the variable nodes, a check node updater 20 for updating the messages transmitted from the variable node to the check node, a variable node updater 30 for updating the messages transmitted from the check node to the variable node, a reference value generator 40 for generating an arrangement reference value for scheduling, that is, a difference of values before and after updating the variable-check messages, and a processor 50 for selecting a variable-check message based on the generated arrangement reference values and operating the check node updater 20 and the variable node updater 30 to perform a decoding process, and it may further include a memory 60 for storing update results caused by the check node updater 20 and the variable node updater 30.

The processor 50 selects the variable-check message with the greatest difference between before update and after update based on the above-described decoding methods, and operates the check node updater 20 and the variable node updater 30 based on the variable-check message to update other check nodes connected to the edge corresponding to the selected variable-check message or update the variable-check messages connected to the variable node corresponding to the selected variable-check message, thereby performing the decoding process.

A decoding method according to the exemplary embodiments of the present invention is applied to the above-described decoding device to perform a simulation and acquire a subsequent simulation result.

Figure 7:
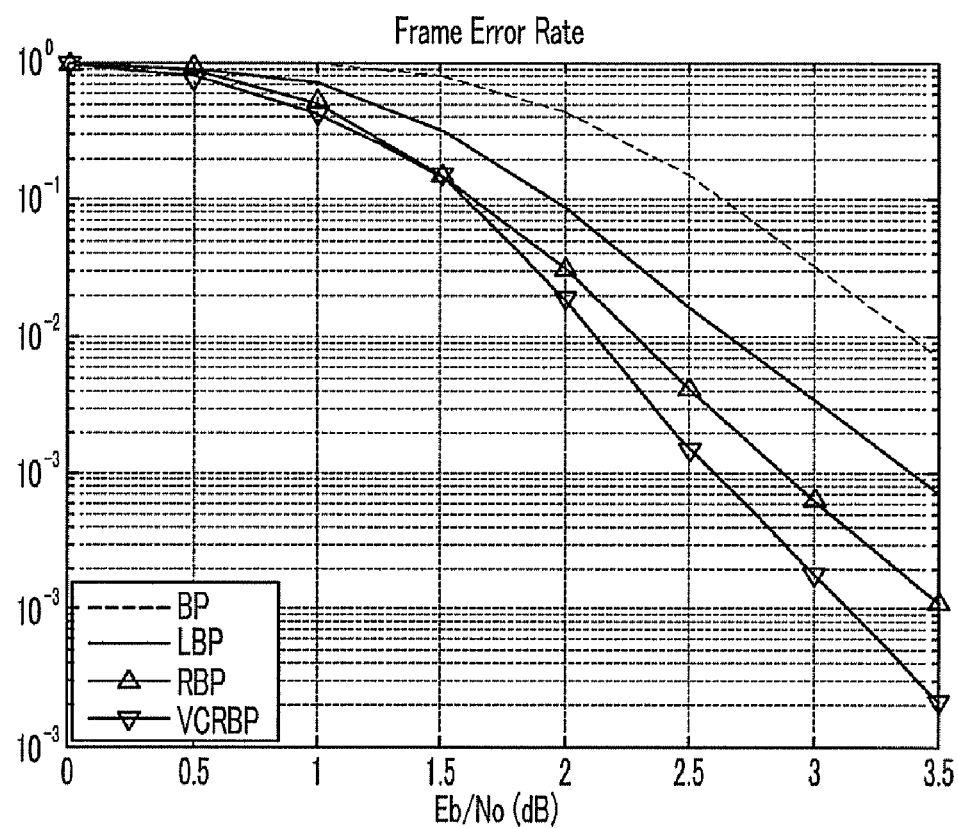
FIG. 7 shows a graph for comparing performance of the decoding method according to the first exemplary embodiment of the present invention and the existing decoding methods.

FIG. 7 shows a graph for comparing performance of the decoding method (VCRBP) according to the first exemplary embodiment of the present invention and the existing decoding methods (BP, LBP, and RBP). Particularly, FIG. 7 shows a graph of frame error rates (FER's) for respective methods when the codes with the code length of the IEEE 802.16e of 576 and the code rate of ½ are used and the maximum iteration number is given as 8. Referring to FIG. 7, the decoding method (VCRBP) according to the first exemplary embodiment of the present invention has improved the FER performance compared to the excellent RBP from among the existing decoding methods by $10^4$ to 0.3 dB.

Figure 8:
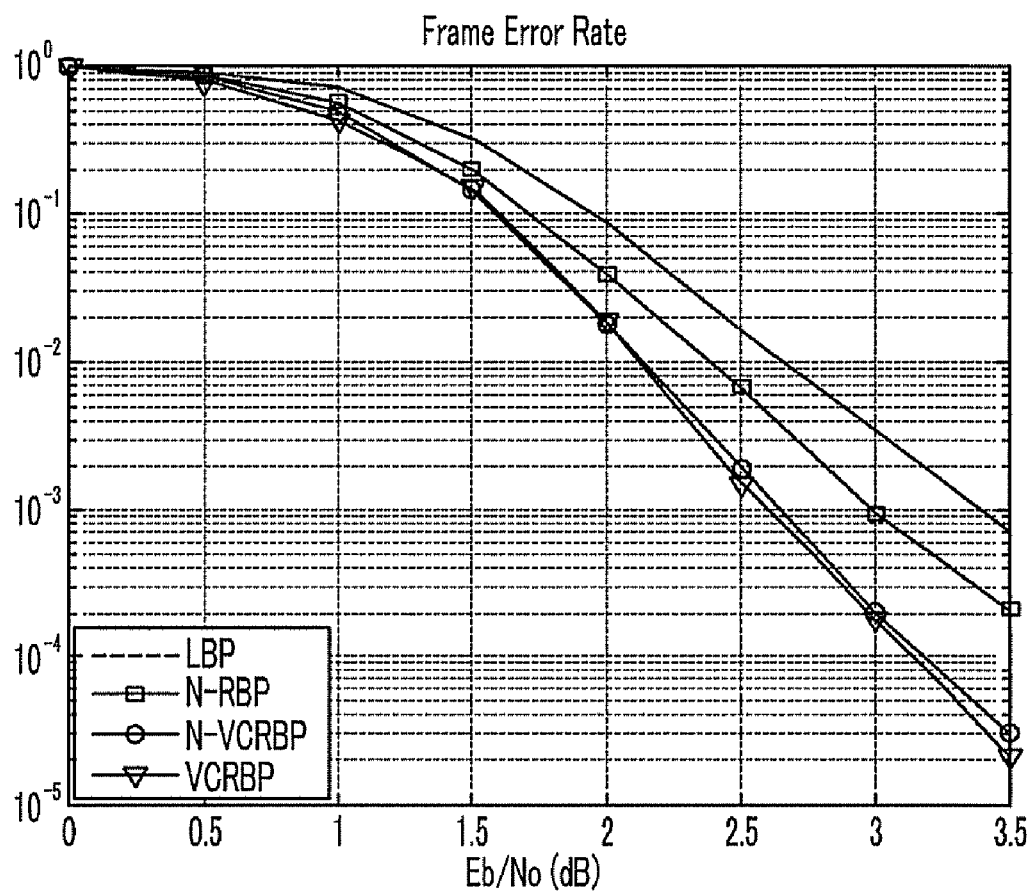
FIG. 8 shows a graph for comparing performance of the decoding methods according to the first and second exemplary embodiments of the present invention and the existing decoding methods.

FIG. 8 shows a graph for comparing performance of the decoding methods (VCRBP and NVCRBP) according to the first and second exemplary embodiments of the present invention and the existing decoding methods (BP, LBP, and RBP). Particularly, FIG. 8 shows a graph of FER's for respective methods when the codes with the code length of the IEEE 802.16e standard of 576 and the code rate of ½ are used and the maximum iteration number is 8. Referring to FIG. 8, the decoding method (NVCRBP) according to the second exemplary embodiment of the present invention has low complexity while the number of comparing the arrangement reference values is reduced, it generates performance similar to the decoding method (VCRBP) according to the first exemplary embodiment of the present invention, and it shows better performance improvement compared to the existing methods.

Figures 9, 10:
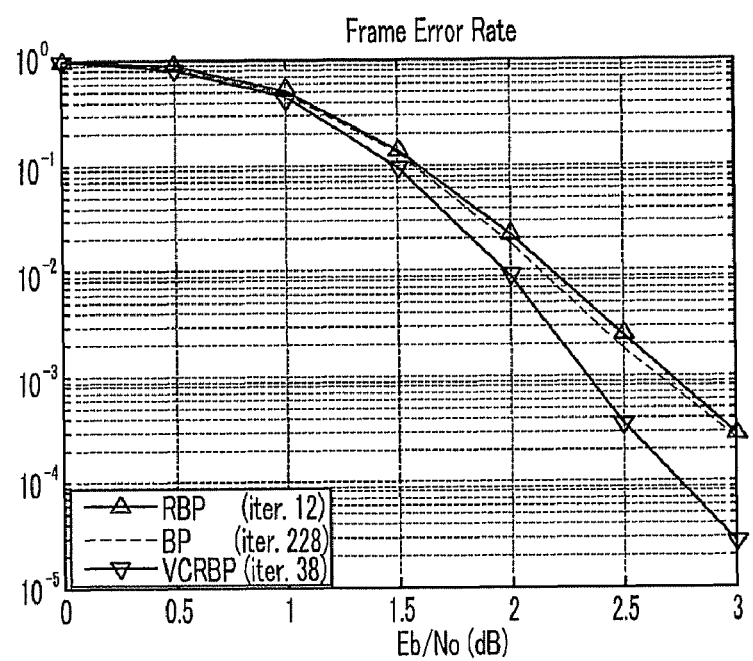
FIG. 9 shows comparison of the approximate computational amount of the decoding method according to the first exemplary embodiment of the present invention and the existing decoding methods.
FIG. 10 shows a graph for comparing performance of the decoding method according to the first exemplary embodiment of the present invention and the existing decoding methods in the case of the same computational amounts based on the computational amount equation of FIG. 9.

FIG. 9 shows comparison of the approximate computational amount of the decoding method (VCRBP) according to the first exemplary embodiment of the present invention and the existing decoding methods (BP, LBP, and RBP). In FIG. 9, regarding comparing the computational amount of the respective decoding methods, since the complexity of the check-variable message function corresponding to Equation 2 is much greater than the variable-check message function corresponding to Equation 1, the approximate computational amount is produced according to the number of times for generating the check-variable message in the respective decoding methods. Referring to FIG. 9, the computational quantity of the decoding method (VCRBP) according to the first exemplary embodiment of the present invention is less than that of the existing decoding method (RBP).

FIG. 10 shows a graph for comparing performance of the decoding method (VCRBP) according to the first exemplary embodiment of the present invention and the existing decoding methods (BP, LBP, and RBP) in the case of the same computational amounts based on the computational amount equation of FIG. 9. In FIG. 10, codes with the code length of 576 with the IEEE 802.16e standard and the code rate of ½ are used, and the maximum iteration numbers are set to be 228, 12, and 38 to compare FER performance. Referring to FIG. 10, the decoding method (VCRBP) according to the first exemplary embodiment of the present invention has excellent performance regarding the same computational amount.

According to the embodiments of the present invention, the rate of the decoding method is increased compared to the existing dynamic scheduling scheme, and its reliability is improved to thus provide excellent decoding performance. Therefore, stabilized data transmission is allowable.

Also, unnecessary operation and rearrangement process are avoided to substantially reduce complexity. Further, since the complexity of the decoding process is reduced, communication with a high data rate is guaranteed. In addition, it is applicable to various next generation systems requiring the error correction skill, as well as to the communication industry.

Also, the variable node including an edge with the great difference of message values of before update and after update during scheduling is selected to update the edges connected to the selected variable node, thereby efficiently reducing the complexity of the decoding process and maintaining excellent decoding performance by reducing the selection number of the decoding process.

The above-described embodiments can be realized through a program for realizing functions corresponding to the configuration of the embodiments or a recording medium for recording the program in addition to through the above-described device and/or method, which is easily realized by a person skilled in the art.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for defining a plurality of check nodes and variable nodes from a parity check matrix and performing a decoding process based on the nodes, comprising:

comparing arrangement reference values of variable-check messages transmitted from the variable node to the check node, selecting the variable-check message with the greatest arrangement reference value, and transmitting the selected variable-check message to the first variable node from the first check node;

updating a check-variable message transmitted from the first check node to the second variable node, regarding the second variable nodes connected to the first check node; and generating an arrangement reference value of the variable-check message transmitted from the second variable node to the second check node based on the updated check-variable message, regarding the second check nodes connected to the second variable node, wherein the variable-check messages are schedules in a descending order of a difference between arrangement reference values before and after updating the variable-check messages message transmitted from the variable node to the check node.

2. The method of claim 1, wherein
the selected variable-check message is transmitted from a first variable node to a first check node, and
the updating of a check-variable message includes updating check-variable messages transmitted from the one first check node to the entire second variable nodes.

3. The method of claim 2, further comprising
excluding the selected variable-check message from a processing target by resetting the arrangement reference value of the selected variable-check message with a setting value.

4. The method of claim 3, wherein
the decoding method sequentially repeats the above-noted stages a plurality of times, and
in the subsequent repeated performance,
the selecting includes excluding the variable-check message with the reset arrangement reference value, and selecting the variable-check message with the greatest arrangement reference value from among other variable-check messages.

5. The method of claim 1, further comprising:
finding a first variable node connected to the selected variable-check message; and
updating the variable-check messages transmitted from the first variable node to the entire first check nodes connected to the first variable node.

6. The method of claim 5, further comprising
excluding the variable-check messages transmitted to the entire first check nodes connected to the first variable node from a processing target by resetting arrangement reference values of the variable-check messages with a setting value.

7. The method of claim 5, wherein
the updating of a check-variable message includes updating check-variable messages transmitted from the entire first check nodes to the entire second variable nodes.

8. The method of claim 1, wherein
the arrangement reference value is an absolute value of a value generated by subtracting a value after updating the variable-check message from a value before updating the variable-check message.

9. The method of claim 1, further comprising, before the selecting:
resetting the variable-check messages transmitted from the variable node to the check node; and
resetting the check-variable messages transmitted from the check node to the variable node.

10. The method of claim 9, wherein
the variable-check messages are reset to be a value corresponding to a channel characteristic having received a received signal, and the check-variable messages are reset to be 0.

11. A device for defining a plurality of check nodes and variable node from a parity check matrix and performing a decoding process, comprising:
a reset unit for resetting variable-check messages transmitted from the variable node to the check node and resetting check-variable messages transmitted from the check node to the variable node;
a check node updater for updating variable-check messages transmitted from the variable node to the check node;
a variable node updater for updating check-variable messages transmitted from the check node to the variable node; and
a processor for comparing arrangement reference values of the entire variable-check messages and selecting a variable-check message that has the greatest arrangement reference value and that is transmitted from the first variable node to the first check node,
wherein the variable-check messages are scheduled in a descending order of a difference between arrangement reference values before and after updating the variable-check messages transmitted from the variable node to the check node.

12. The device of claim 11, wherein
the processor finds a first variable node connected to the selected variable-check message, and
the check node updater updates variable-check messages transmitted to entire first check nodes connected to the first variable node from the first variable node.

13. The device of claim 12, wherein
the variable node updater updates check-variable messages transmitted from the entire first check nodes to the entire second variable nodes.

14. The device of claim 12, wherein
the processor resets an arrangement reference value of the selected variable-check message to be a setting value, or resets arrangement reference values of the variable-check messages transmitted to the entire first check nodes connected to the first variable node to be a setting value and excludes the same.

15. The device of claim 11, wherein
the arrangement reference value is an absolute value of a value that is generated by subtracting a value after updating the variable-check message from a value before updating the variable-check message.

16. The device of claim 11, wherein
the variable node updater updates a check-variable message transmitted from the first check node to the second variable node according to control by the processor, regarding the entire second variable nodes connected to the first check node, and
the check node updater generates an arrangement reference value of a variable-check message transmitted from the second variable node to the second check node base on the updated check-variable message, regarding the entire second check nodes connected to the second variable node.

* * * * *